(12) United States Patent
Poguntke

(10) Patent No.: US 8,136,734 B2
(45) Date of Patent: Mar. 20, 2012

(54) CARD READER USING THE PUSH-PUSH SYSTEM

(75) Inventor: Matthias Poguntke, Heilbronn (DE)

(73) Assignee: Amphenol-Tuchel Electronics GmbH, Heilbronn (DE)

( * ) Notice: Subject to any disclaimer, the term of this patent is extended or adjusted under 35 U.S.C. 154(b) by 578 days.

(21) Appl. No.: 12/295,192

(22) PCT Filed: Mar. 2, 2007

(86) PCT No.: PCT/EP2007/001830
§ 371 (c)(1),
(2), (4) Date: May 7, 2009

(87) PCT Pub. No.: WO2007/115609
PCT Pub. Date: Oct. 18, 2007

(65) Prior Publication Data
US 2009/0308930 A1    Dec. 17, 2009

(30) Foreign Application Priority Data

Mar. 31, 2006  (DE) .......................... 10 2006 015 006

(51) Int. Cl.
*G06K 7/00*    (2006.01)
*G06K 19/06*   (2006.01)
*H01R 13/62*   (2006.01)

(52) U.S. Cl. .......................... 235/486; 235/492; 439/159

(58) Field of Classification Search .................. 235/380, 235/486, 492; 439/159
See application file for complete search history.

(56) References Cited

U.S. PATENT DOCUMENTS

| 5,984,702 | A  | * | 11/1999 | Nishioka ........................ 439/159 |
| 6,467,690 | B1 | * | 10/2002 | Reeves .......................... 235/486 |
| 6,616,053 | B2 | * | 9/2003  | Kondo et al. .................. 235/492 |
| 2003/0068927 | A1 |   | 4/2003  | Nakamura |
| 2005/0277318 | A1 |   | 12/2005 | Tsuji |
| 2006/0003617 | A1 | * | 1/2006  | Motojima ..................... 439/159 |
| 2006/0226242 | A2 | * | 10/2006 | Kim ............................. 235/492 |

FOREIGN PATENT DOCUMENTS

DE    10 2005 029898 A1    1/2006

OTHER PUBLICATIONS

International Search Report, mailed May 31, 2007.

* cited by examiner

*Primary Examiner* — Thien T Mai
(74) *Attorney, Agent, or Firm* — Blank Rome LLP

(57) ABSTRACT

A card reader using the push-push system (20) comprising an integral push module (23, 24) movable in the direction of insertion of a card, said push-push module being pivotable in the direction of card insertion and in elevational direction.

8 Claims, 4 Drawing Sheets

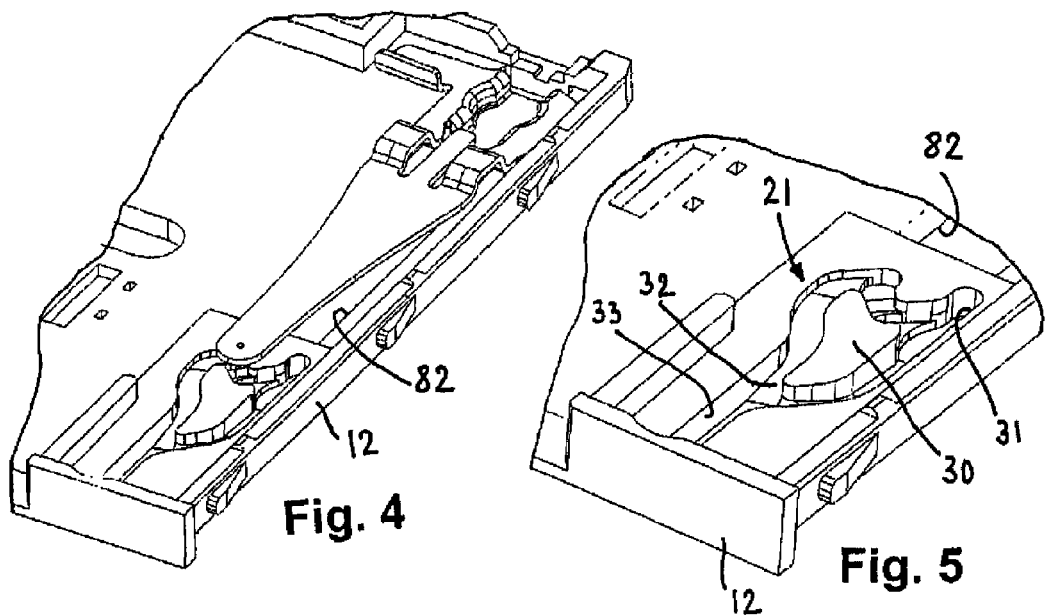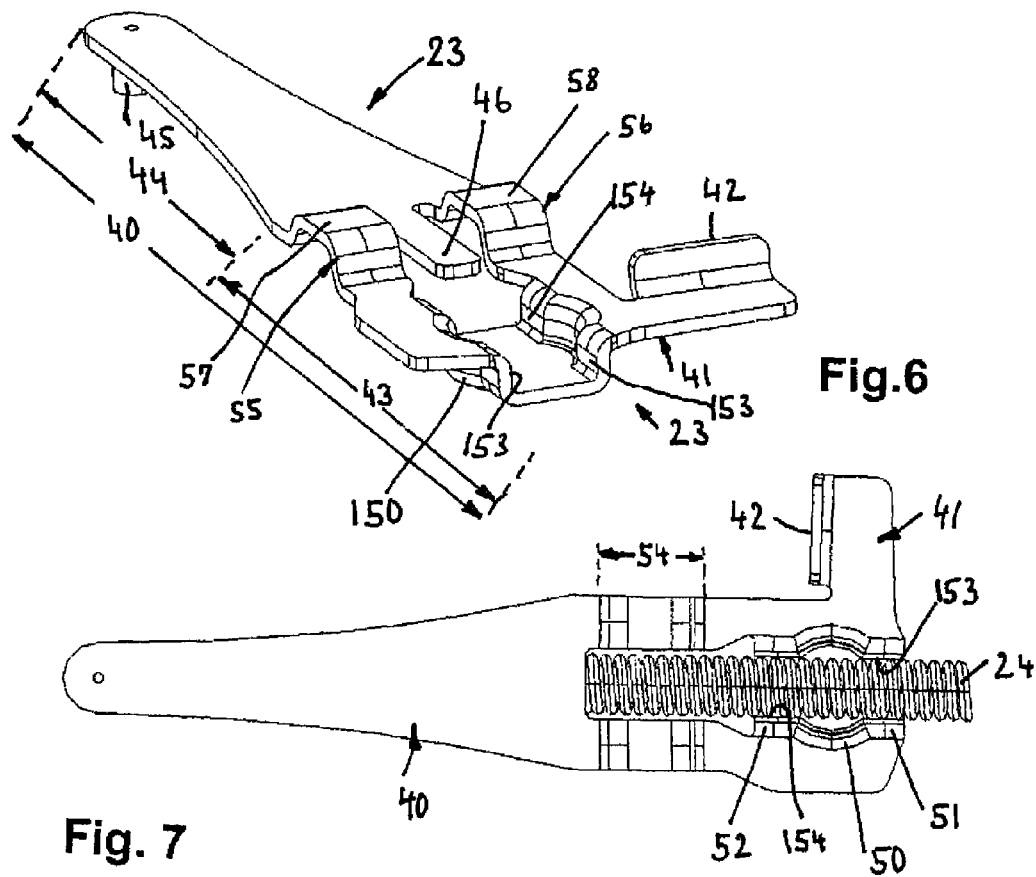

CARD READER USING THE PUSH-PUSH SYSTEM

This application is a National Phase of PCT/EP2007/001830 filed 2 Mar. 2007, which claims priority to DE 10 2006 015 006.6 filed 31 Mar. 2006, which is hereby incorporated by reference.

The present invention relates to a card reader using the push-push system. Preferably, the invention refers to a SIM card reader.

A push-push system (PPS) comprises in substance the following components: A heart-shaped curve, a push element, a guide element and a spring. The heart-shaped curve provides for the definition of individual steps when pushing the card into the reader. The different steps of pushing the card into the reader are as follows:
1. Pushing the card into the card reader up to an abutment;
2. releasing the card, with the consequence that the card is pushed by the the spring, by the push element, and by the guide element into a rest position;
3. pushing the card, for removing the card, to the rear abutment;
4. releasing the card, with the consequence that the card is ejected by means of the spring, the push element, and the guide element;
5. removing the card.

In the known push-push system, a guide element is provided in addition to a push element, with the one component providing guidance in longitudinal direction while the other component provides guidance in a rotary direction. As is known, the rotary movement is a consequence of the angular movement of the push element in the heart-shaped curve.

According to the invention only one component is provided, which is called a push module, to realize elevational guidance, longitudinal guidance and rotary guidance. The required guide means are integrated in the push module. In accordance with the invention, the push module is designed as a part of the required longitudinal support for the spring, with the spring guidance being integrated in all directions.

Preferably, card abutment means as well as a spring arm, which allows the elevational movement required by the heart-shaped curve, are integrated in the push module.

When a longitudinally extending spring is used, preferably the form of coil spring is used, then the first already mentioned longitudinal spring support is provided by the push module, and the second longitudinal spring support is preferably formed by the cover. The second longitudinal spring support can, however, also be formed by the contact support.

In accordance with the invention a card reader using the push-push (PPS) system is provided. The card reader comprises the contact support which supports contacts and the cover covers the contact support, which is preferably open at its upper side so as to form a card-receiving space for the card. The push-push system uses heart-shaped curve means and a push-push system comprising spring means. The insertion and the removal of the card can be carried out in the following manner.

A push (first push) is applied against the back end of the card which is to be inserted into the card reader, causing the card to be placed in the reading position. To remove the card, a further push (second push) is applied to the back end of the card, an end projecting generally out of the contact support so as to provide for an automatic ejection of the card by means of the push-push system, allowing the removal of the card.

The push-push system preferably comprises a unitary or integral push module which can be moved in the direction of the insertion of the card and which is pivotable with respect to the direction of insertion of the card, and which is also pivotable elevationally (i.e., in upward direction). When inserting the card into the card reader (first push), the card is in contact with the push module and moves it in the direction of insertion and pivots it laterally as well as in upward direction. At the end of the insert movement, the card will be locked in the reading position. A subsequent push will release the locking of the push module within the heart-shaped curve arrangement and the push module will move the card, which is in engagement with a card abutment formed by the push module, out of the reading position so that the card can be taken out of the card reader.

Preferred embodiments of the invention are disclosed in the claims.

Further advantages, objects and details of the invention can be gathered from the description of an embodiment shown in the drawing.

FIG. 4 is a detail of the card reader of FIG. 2;

FIG. 5 is an enlarged representation of the heart-shaped design of FIG. 4;

FIG. 6 is a perspective top plan view of the push module of the invention;

FIG. 7 is a top plan view of the push module, with a spring being inserted;

All figures show a card reader 10 using a push-push system (PPS) 20. More specifically, however, the card reader 10 of the invention uses a push-push module system 22. The push-push module system 22 uses a heart-shaped design 21 which, as such, is known in the art and will be explained below.

The push-push card reader 10 of the invention is, preferably—as shown—a SIM card reader. The invention, however, can also be used in card readers for e.g. smart cards or chip cards.

Figure 1:
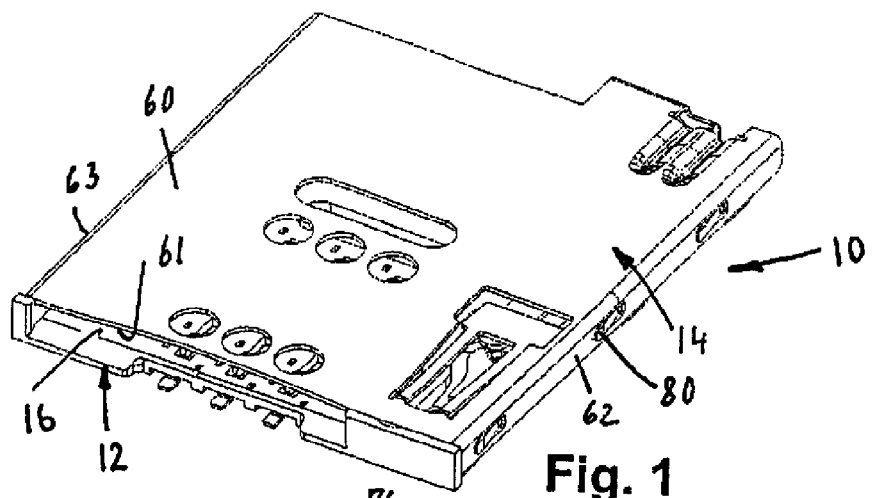
FIG. 1 is a perspective top plan view of a card reader of the invention with a cover.
Figure 2:
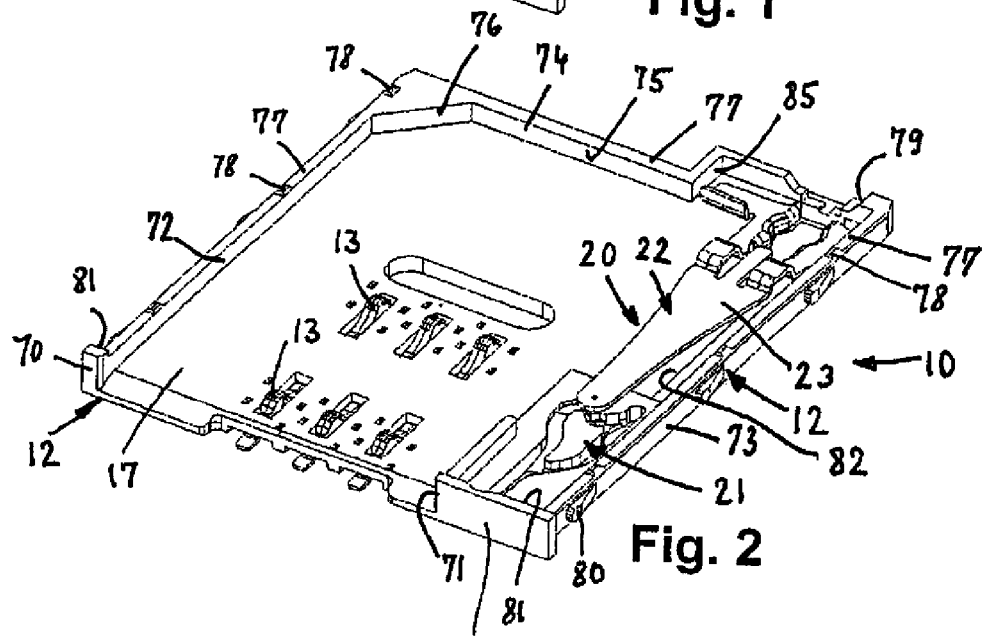
FIG. 2 is a top plan view of the card reader of FIG. 1 with the cover being removed.
Figure 3:
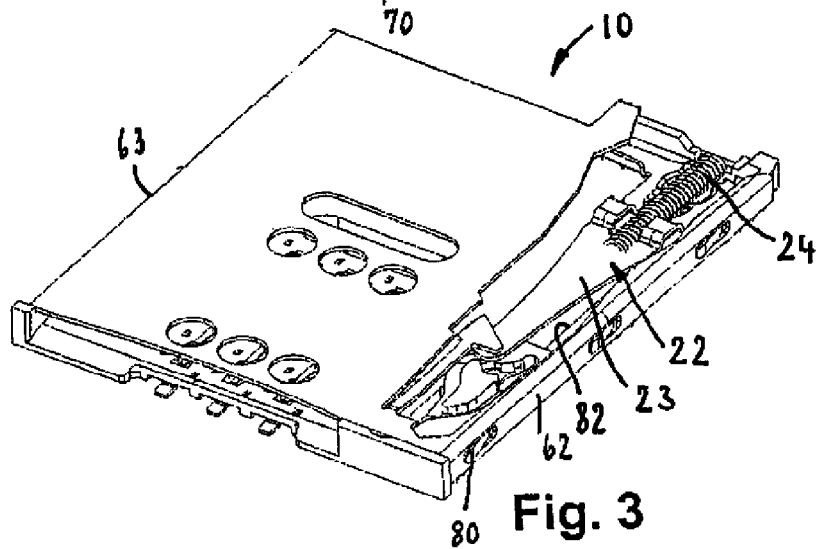
FIG. 3 is a top plan view of the card reader in accordance with FIGS. 1 and 2, with the cover being partially removed.
Figure 8:
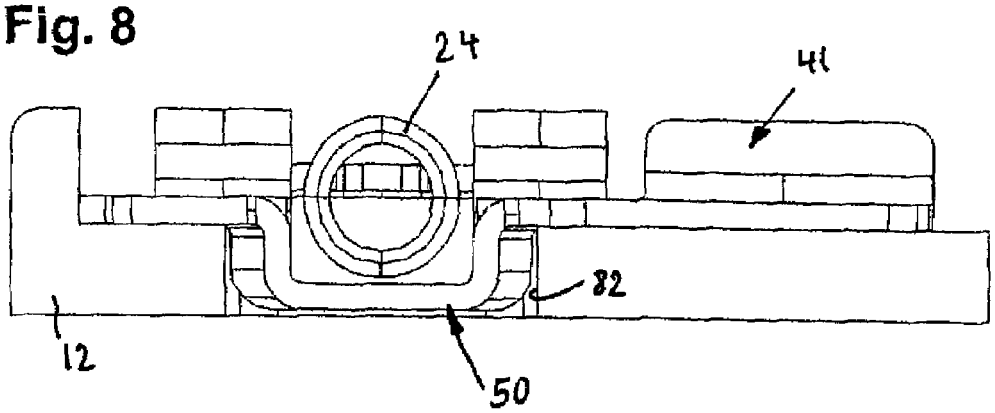
FIG. 8 is a schematic cross sectional view approximately in the area referred to by the reference sign 78 in FIG. 2.
Figure 9:
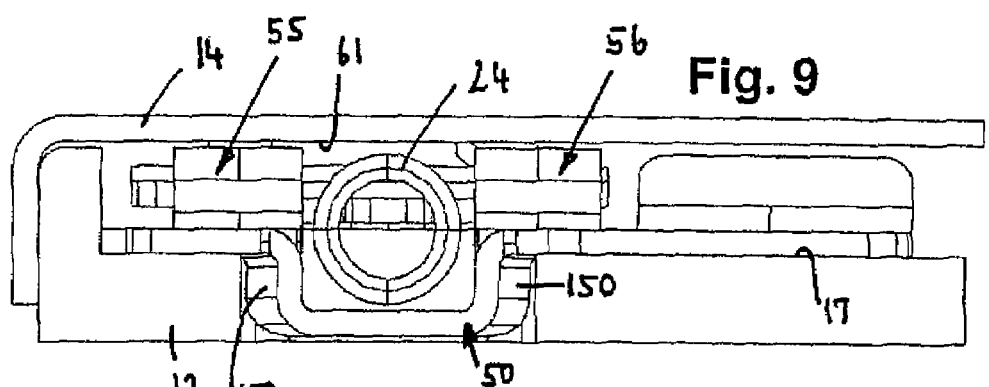
FIG. 9 is a representation similar to FIG. 8, with the cover being attached.

The card reader 10 comprises a contact support 12. As shown in FIG. 2, contacts 13, e.g. reading contacts 13, are mounted in the contact support 12. The reading contacts 13 are adapted to contact the contact pads of a SIM card 1 (see FIG. 11) at the time the card 1 is placed in its reading position.

The contact support 12 has an upper surface, is open at the upper surface, and is closed by a cover 14. Between a bottom side 61 of the cover 14 and a card support surface 17 formed by the upper surface of the contact support 12, a card receiving space 16 is formed into which the card can be inserted by sliding (pushing) it into said space 16 until the card reaches its reading position. This push movement occurs against the force of spring means, for instance a spring 24, which will be described below. To remove the card 1 out of its reading position, in accordance with the push-push module system 22, a short push against the "rear" edge of the card, i.e., the edge of the card which is located opposite to the direction of insertion, causes that the card 1 is moved out of the reading position into a take-out position, or the card 1 is ejected.

The Push-Push Module System 22

The push-push system 20, in general, is known and uses, as is shown in FIG. 2, a heart curve system 21 comprising a heart curve. In addition to the heart curve system 21, known push-push push systems use a push element and a guide element.

In accordance with the invention, the push-push module system 22 is designed such that an integrated push module 23, 24 is provided which comprises a push element 23 as well as spring means 24 which are preferably integrated therein. The spring means comprise a spring 24.

The Heart Curve System 21

Figure 10:
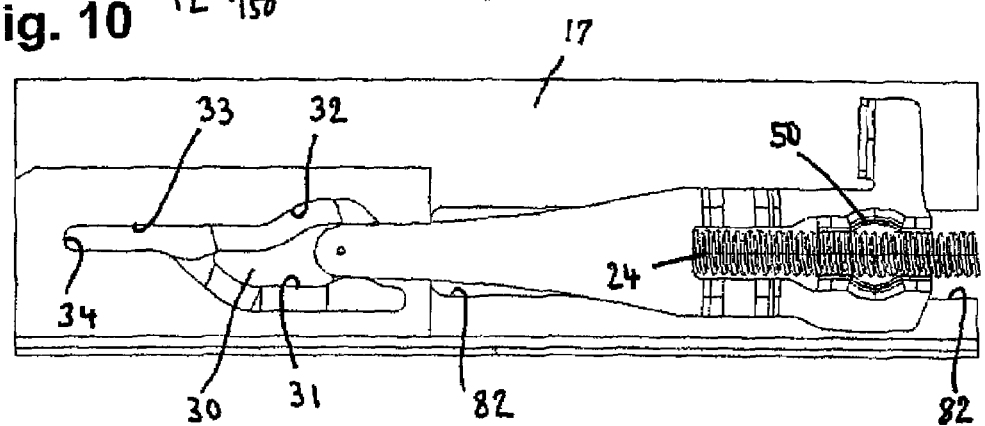
FIG. 10 is a top plan view of a part of the card reader, with the cover being removed.

Heart curve systems of the type of the heart curve system 21 shown are known in the prior art. As shown in FIG. 5, the heart curve system 21 comprises a heart-shaped guide element 30. Guide channels or grooves 31, 32 are located on both sides of the guide element 30 in the direction of insertion of the card. The guide channels 31, 32 are connected by a straight-line guide channel 33 which extends opposite to the direction of insertion. The guide channel 33 comprises an abutment end 34 (FIG. 10). The guide channels 31, 32 form at the opposite end the necessary locking and guide surfaces so as to provide for the push-push function. As can be seen for instance in FIG. 5, the guide channels 31, 32 are located on different levels, a fact which has to be taken into consideration when designing a push-push module system and in particular a push-push module system 22 in accordance with the invention.

The Push Module 23, 24

The push module 23, 24 is shown in detail for instance in FIGS. 6 through 12.

The push element 23 comprises—see FIG. 6—a longitudinally extending guide arm 40 as well as a shorter abutment arm 41 which extends preferably perpendicular to the guide arm 40 and which forms card abutment means, i.e., a card abutment surface 42.

The guide arm 40 comprises a guide section, also referred to as a spring arm 44. At the end of the guide section 44, a pin 45 is mounted and projects downwardly. Moreover, the guide arm 40 comprises a support section 43. The support section 43 forms different support means, in particular support and guidance for the rotary, for the longitudinal and also for the elevational movement of the push element.

Figure 11:
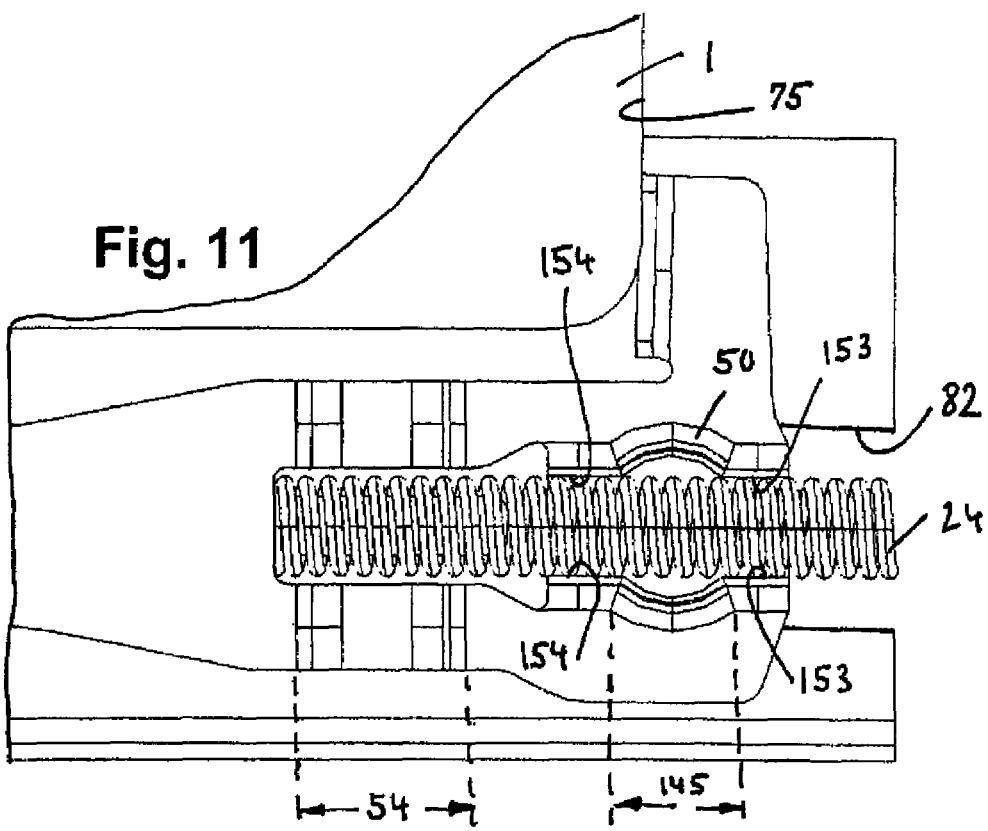
FIG. 11 is a detail of the card reader, with the card being located in the reading position.

FIGS. 6 and 11 disclose in detail a first U-shaped section 51 and a second U-shaped section 52. The first and second U-shaped sections 51, 52 each form lateral spring supports 153 and 154, respectively, which are also called spring abutment surfaces.

Moreover, the support section 43 comprises an elevational support section 54 which is formed by two spaced projections 55, 56. The projections 55, 56 form elevational guides 57 and 58, respectively, provided at the upper support or bearing surfaces which extend preferably in a plane. Said elevational guides or support surfaces 57, 58 are in contact with a bottom surface 61 of the cover 14 at the time the card reader 10 is completely assembled.

The support section 43 comprises besides spring guide sections 51, 52, which are U-shaped in cross section, a guide section 145 for a rotary and longitudinal motion. The rotary and longitudinal guide section 145 provides for a rotary and longitudinal guidance and allows a certain amount of movement in elevational direction for the entire push element 23. The rotary and longitudinal guide section 145 forms a rotary pin 50. The rotary pin 50 is formed by parts of the sheet metal which preferably forms the push element 23. Said parts of the push element are pressed downwardly, as can be seen in FIG. 6. In this manner, on both sides of the rotary pin outer bearing surfaces 150 are formed which are in slide contact with guide or bearing surfaces formed by a guide groove 82 in the contact support 12.

Spring means, preferably the coil spring 24, are integrated into the push element 23. On the side, the spring 24 is mounted on a tongue 46 forming a longitudinal spring support. The tongue 46 extends in the area of the elevational support section 54 into a recess between the projections 57, 58. On the other side, the spring 24 is supported with its other end at a further longitudinal spring support formed by the contact support. In accordance with the shown preferred embodiment, the further longitudinal spring support is formed by the cover.

The push element 23 is preferably made of sheet metal and is stamped and pressed into the form shown in FIG. 6.

Figure 12:
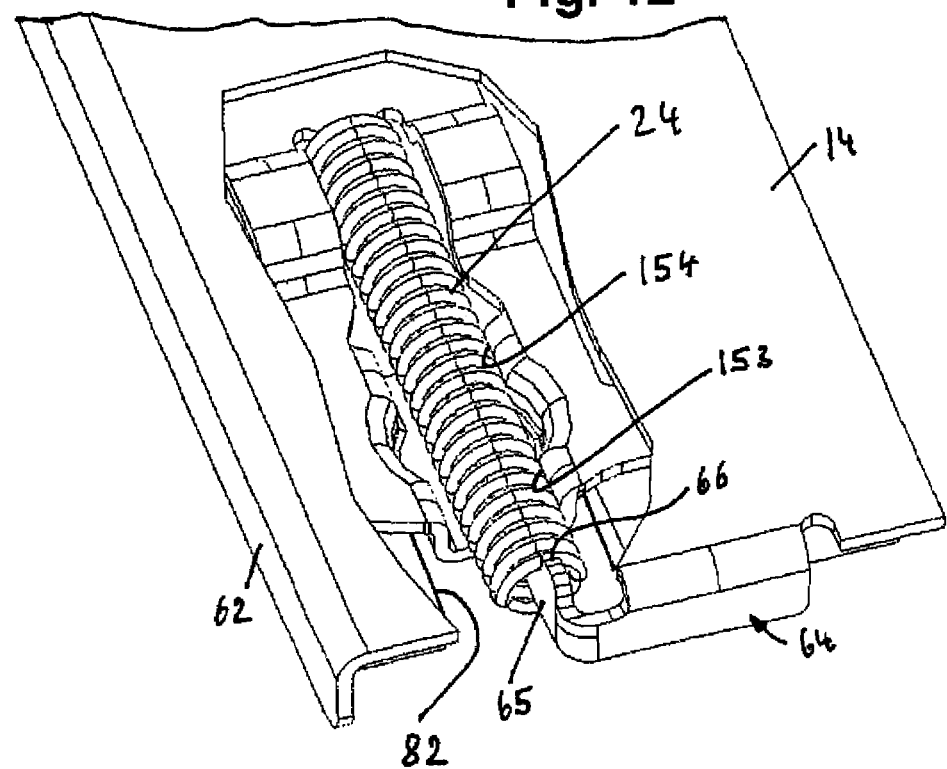
FIG. 12 is an isometric top plan view showing on the one hand the longitudinal support of the spring in the push module and showing on the one hand the support of the push module at the cover.

The cover 14 is preferably made of sheet metal and comprises, besides the bottom side 61, an upper side 60 as well as spaced side walls 62, 63, which are provided with openings adapted to come into engagement with detent cams 80 formed by the contact support 12. The cover 14 further comprises preferably a back or rear wall 64 which does not need to extend across the entire backside of the contact support 12 but can extend, as is shown in FIG. 12, for instance only over a portion of the backside, forming a spring mounting rib 65 for the spring 24. The spring holding rib 64 forms a spring abutment 66 at which the coil spring 24 abuts with its one end. As already mentioned, the spring abutment for this end of the spring 24 could also be formed by the contact support.

The Contact Support 12

The contact support 12 comprises, as is shown in particular in FIG. 2, on both sides short front wall portions 70 which form an opening 71 leading to the card receiving space 16. Moreover, the contact support 12 comprises spaced side walls 72 and 73 which are connected by a rear wall 74. The rear wall 74 forms a first card abutment surface 75 and adjacent thereto an inclined abutment surface 76. The side walls 72 and 73 as well as the rear wall 74 form an upper edge 77 located on the same level. The cover 16 is supported with its bottom side 61 on the upper edge 77. Cams 78 are provided on the upper edge 77 and project upwardly.

The rear wall 74 forms a recess 85 adapted to receive the abutment arm 41. The rear wall 74 further is provided with a recess 79. The spring holding rib 65 can extend through said recess 79. The front wall portions 70 form abutment edges 81 for supporting the forward edge of the cover 60.

The contact support 12 is preferably made of plastic material, preferably by injection molding.

In all figures, the SIM card reader 10 of the invention is shown in an operating position with the SIM card 1 being inserted and being located in its reading position. The SIM card 1 is only shown in FIG. 11. In the reading position of the SIM card 1, see FIG. 11, the abutment surfaces 75 at the contact support and the abutment surface 42 of the push element 23 are aligned.

If no card 1 is inserted, the push element 23 is pressed by means of the spring 24 in a direction opposite to the insert direction of the card, i.e., the pin 45 is subject to spring pressure and abuts at the abutment end 34. At the time a card is inserted into the card space 16 and is moved until the card abuts at the card abutment 42, the continued pressure on the card 1 (first push) moves the push element 23 into the insert direction with the pin moving in the guide path 32 to eventually come into engagement at the locking or detent position of the heart curve in accordance with the design of the heart curve system 21. In this detent or locking position of the push element 23, the cards 1 is in its reading position.

When pressing against the rear or back end of the card (second push), the pin is lifted out of the detent locking position and the spring 24 presses against the push element 23 moving it in a direction opposite to the card insert direction together with the card 1. Thus, the card being in contact with the card abutment 42, is moved or slid out of the card receiving space.

The invention claimed is:

1. A card reader using the push-push system (PPS) comprising:
    a contact support supporting contacts, in particular reading contacts, a cover open at its upper surface and mounted on the contact support, said cover forming together with the contact support a card receiving space,
    wherein said push-push system comprises a heart-shaped curve design and a push-push module system using spring means,
    said push-push module system being designed such that the card is insertable into the card reader to remain in its reading position by applying pressure (first push) against a rear end of the card, and
    such that the card is removed by applying pressure (second push) against the rear end of the card,
    wherein said push-push module system further comprises an integral part push module which is pivotable with respect to the direction of insertion of the card and also in an elevational direction,
    wherein said push module, when contacted by the card during insertion (first push) is moved by said card in the direction of insertion with the push module being configured to pivot laterally and elevationally, and
    wherein at the end of the insert movement, the card is locked in the reading position and a subsequent push releases the locking of the push module in the heart-shaped curve arrangement and the push module moving the card out of the reading position so that the card is taken out of the card reader,
    said push module comprising a single push element which is supported in the card space or adjacent to the card space, said single push element being longitudinally movable in the direction of card insertion and pivotable laterally as well as elevationally, said push element including a guide arm and an abutment arm having a card abutment, said guide arm having a guide section which acts as a spring arm and a support section for the push element to allow pivotable movements both for a rotational motion and a longitudinal motion.

2. The card reader according to claim 1, wherein the support section comprises a pin providing for a translational and pivotable mounting within a guide groove is provided in the contact support.

3. The card reader according to claim 2, wherein the support section comprises first and second U-shaped sections which form lateral spring support surfaces.

4. The card reader according to claim 1, wherein the spring means are located in a space provided between two projections formed by the guide section and on a tongue which extends into the space between the projections.

5. The card reader according to claim 1, wherein the spring means is inserted in a space formed by spring abutment surfaces of the push module and is supported with one end at a support means formed at the contact support and at the cover, respectively.

6. The card reader according to claim 5, wherein the spring means is supported with its one end at the guide element, and with the other end at a spring holding rib formed by the cover.

7. The card reader according to claim 6, wherein the spring holding rib is formed at a rear wall of the cover and comprises a spring abutment.

8. A card reader using the push-push system (PPS) comprising:
    a contact support supporting contacts, in particular reading contacts, a cover open at its upper surface and mounted on the contact support, said cover forming together with the contact support a card receiving space,
    wherein said push-push system comprises a heart-shaped curve design and a push-push module system using spring means,
    said push-push module system being designed such that the card is insertable into the card reader to remain in its reading position by applying pressure (first push) against a rear end of the card, and
    such that the card is removed by applying pressure (second push) against the rear end of the card,
    wherein said push-push module system further comprises an integral part push module which is pivotable with respect to the direction of insertion of the card and also in an elevational direction,
    wherein said push module, when contacted by the card during insertion (first push) is moved by said card in the direction of insertion with the push module being configured to pivot laterally and elevationally, and
    wherein at the end of the insert movement, the card is locked in the reading position and a subsequent push releases the locking of the push module in the heart-shaped curve arrangement and the push module moving the card out of the reading position so that the card is taken out of the card reader,
    said push module comprising a single push element which is supported in the card space or adjacent to the card space, said single push element being longitudinally movable in the direction of card insertion and pivotable laterally as well as elevationally,
    wherein the spring means is inserted in a space formed by spring abutment surfaces of the push module and is supported with one end at a support means formed at the contact support and at the cover, respectively.

* * * * *